(12) United States Patent
Sharma et al.

(10) Patent No.: US 7,804,157 B2
(45) Date of Patent: Sep. 28, 2010

(54) DEVICE CONFIGURED TO HAVE A NANOWIRE FORMED LATERALLY BETWEEN TWO ELECTRODES AND METHODS FOR FORMING THE SAME

(75) Inventors: Shashank Sharma, Sunnyvale, CA (US); Theodore I. Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 957 days.

(21) Appl. No.: 11/454,446

(22) Filed: Jun. 16, 2006

(65) Prior Publication Data

US 2007/0290370 A1     Dec. 20, 2007

(51) Int. Cl.
*H01L 29/861* (2006.01)

(52) U.S. Cl. .................. 257/653; 257/784; 977/720; 977/762

(58) Field of Classification Search .................. 257/734, 257/653; 438/478; 977/700, 701, 720, 762
See application file for complete search history.

(56) References Cited

U.S. PATENT DOCUMENTS

| | | | |
|---|---|---|---|
| 6,297,063 B1 | 10/2001 | Brown et al. | |
| 6,383,923 B1 | 5/2002 | Brown et al. | |
| 2002/0172820 A1* | 11/2002 | Majumdar et al. | 428/357 |
| 2005/0079659 A1* | 4/2005 | Duan et al. | 438/197 |
| 2005/0133476 A1 | 6/2005 | Islam et al. | |

OTHER PUBLICATIONS

Islam et al.; "Nano-Bridging: a Massively Parallel Self-assembly Tehcnique for Interconnecting Nanowire Sensors"; 2004; Proceedings of SPIE vol. 5593, pp. 101-111.*
"Growth of nanowire superlattice structures for nanoscale photonics and electronics" to Gudiksen et al. Published in Nature, vol. 415, pp. 617-620. Feb. 7, 2002.*
Islam, et al., "Ultrahigh-Density Silicon Nanobridges Formed Between Two Vertical Silicon Surfaces", Nanotechnology 15 (2004), pp. L5-L8.
Islam, et al., "A Novel Interconnection Technique for Manufacturing Nanowire Devices", Appl. Phys. A 80 (2005) pp. 1133-1140.
Bradbury, et al., "Control of Lateral Epitaxial Chemical Vapor Deposition of Silicon Over Insulators", J. Appl. Phys. 55 (2), Jan. 1984, pp. 519-523.

* cited by examiner

*Primary Examiner*—A. Sefer
*Assistant Examiner*—Allen L Parker (57) ABSTRACT

A device configured to have a nanowire formed laterally between two electrodes includes a substrate and an insulator layer established on at least a portion of the substrate. An electrode of a first conductivity type and an electrode of a second conductivity type different than the first conductivity type are established at least on the insulator layer. The electrodes are electrically isolated from each other. The electrode of the first conductivity type has a vertical sidewall that faces a vertical sidewall of the electrode of the second conductivity type, whereby a gap is located between the two vertical sidewalls. Methods are also disclosed for forming the device.

12 Claims, 4 Drawing Sheets

DEVICE CONFIGURED TO HAVE A NANOWIRE FORMED LATERALLY BETWEEN TWO ELECTRODES AND METHODS FOR FORMING THE SAME

STATEMENT REGARDING FEDERALLY SPONSORED RESEARCH OR DEVELOPMENT

This invention was made in the course of research partially supported by the Defense Advanced Research Projects Agency, Agreement No. HR0011-05-3-0001. The U.S. government has certain rights in the invention.

BACKGROUND

The present disclosure relates generally to devices configured to have a nanowire formed laterally between two electrodes, and methods for forming the same.

Since the inception of semiconductor technology, a consistent trend has been toward the development of smaller device dimensions and higher device densities. As a result, nanotechnology has seen explosive growth and generated considerable interest. Nanotechnology is centered on the fabrication and application of nano-scale structures, or structures having dimensions that are often 50 to 100 times smaller than conventional semiconductor structures. Nanowires are included in the category of nano-scale structures.

Nanowires are wire-like structures having diameters on the order of about 1 nm to about 100 nm. Nanowires are suitable for use in a variety of applications, including functioning as conventional wires for interconnection applications or as semiconductor devices. While holding much promise, the practical application of nanowires has been somewhat limited. In particular, providing nanowires, especially laterally positioned nanowires, that can be fabricated in production quantities for a reasonable cost has proven difficult. This may be due, at least in part, to the difficulty involved in producing device platforms that allow for the self-assembly and integration of the nanowire. One difficulty that may be encountered in producing such device platforms is making good electrical contact (using electrodes, connections, or the like) to the nanowires in order to bring electrical signals into the nanowires. Another difficulty that may be encountered in producing such device platforms is forming electrodes having different conductivity types.

Techniques that include suspending nanowires in a solvent, dispersing them on a device platform, and making electrical contacts are generally slow and potentially unreliable processes.

Another potential problem with many nanowire integration techniques is that contamination may result from additional processing.

SUMMARY

A device configured to have a nanowire formed laterally between two electrodes is disclosed herein. The device includes a substrate and an insulator layer established on at least a portion of the substrate. An electrode of a first conductivity type and an electrode of a second conductivity type different than the first conductivity type are established at least on the insulator layer. The electrodes are electrically isolated from each other. The electrode of the first conductivity type has a vertical sidewall that faces a vertical sidewall of the electrode of the second conductivity type, whereby a gap is located between the two vertical sidewalls.

A method for forming a device configured to have a nanowire formed laterally between two electrodes is also disclosed herein. The method includes forming an electrode of a first conductivity type from a silicon layer of a silicon-on-insulator substrate, where the silicon layer has the first conductivity type. A portion of an insulator layer of the silicon-on-insulator substrate is removed so that at least a portion of a substrate surface is exposed. An epitaxial layer is established on at least the exposed portion. The epitaxial layer of the second conductivity type forms an electrode of the second conductivity type that is electrically isolated from the electrode of the first conductivity type.

BRIEF DESCRIPTION OF THE DRAWINGS

Features and advantages of embodiment(s) of the present disclosure will become apparent by reference to the following detailed description and drawings, in which like reference numerals correspond to similar, though not necessarily identical components. For the sake of brevity, reference numerals or features having a previously described function may not necessarily be described in connection with other drawings in which they appear.

DETAILED DESCRIPTION

Embodiments of the device disclosed herein are advantageously capable of having nanowire(s) grown laterally between two electrodes. In an embodiment, the device includes at least two electrically isolated electrodes, each of which may have a different conductivity type (e.g., p-type and n-type electrodes). Growth of the nanowire is initiated at one of the electrodes, and a connection is formed at the other of the electrodes. The electrodes of different conductivity types are advantageously capable of having nanowires with multiple segments having different conductivity types or different materials (e.g., different from other segments and/or different from the electrode materials) formed therebetween. The connection between the nanowire and the electrodes and/or between the various segments of the nanowire may advantageously be electrically useful (e.g., an ohmic connection, a junction (i.e., a diode), or the like).

Figure 1A:
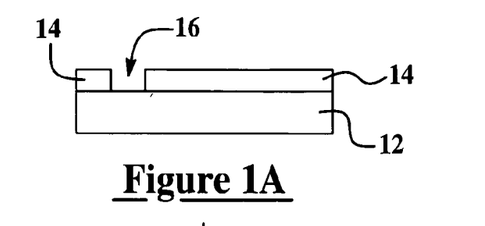
FIGS. 1A through 1H depict embodiments for forming alternate embodiments of a device configured to have a nanowire formed laterally between two electrodes.
Figure 1B:
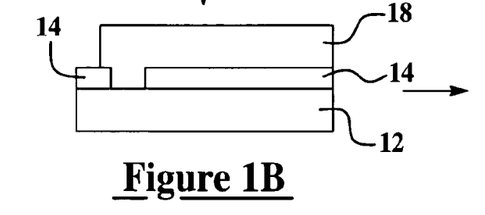
Figure 1C:
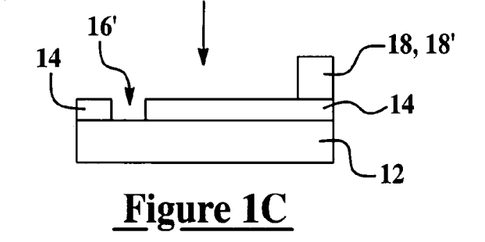
Figure 1D:
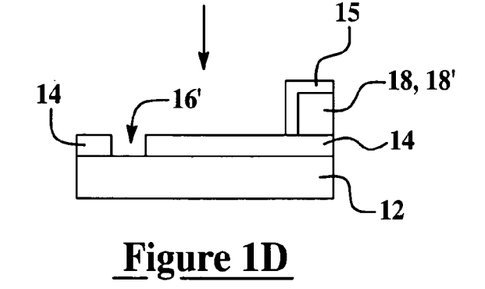
Figure 1E:
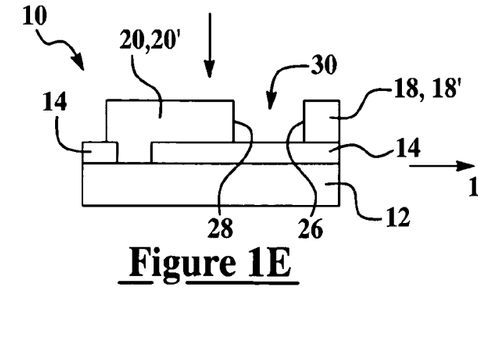
Figure 1F:
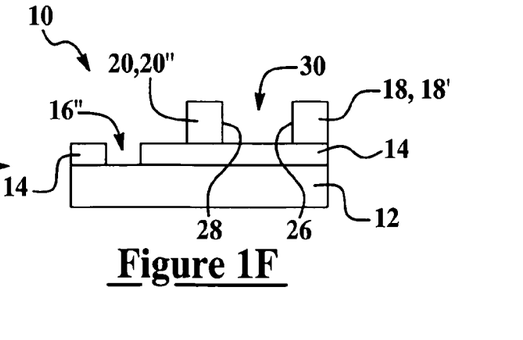
Figure 1G:
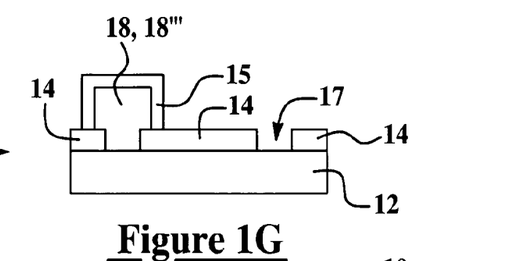
Figure 1H:
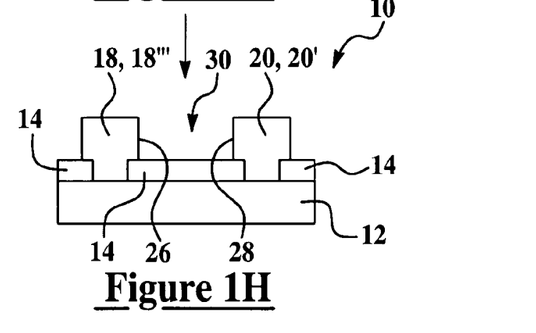

Referring now to FIG. 1A, an embodiment of the method for forming the device 10 (an embodiment of which is shown in FIG. 1E, another embodiment of which is shown in FIG. 1F, and still another embodiment of which is shown in FIG. 1H) includes establishing an insulator layer 14 on a substrate 12 so that a portion 16 of the substrate surface remains exposed.

In an embodiment, the substrate 12 is silicon (Si) cut or polished with the surface plane being a (110) crystal lattice plane. Such a substrate 12 is referred to as a (110) oriented Si substrate. As used herein, the (110) plane is considered to be horizontally oriented with respect to the Cartesian coordinate system. The (110) oriented substrate 12 further has (111) planes of the Si crystal lattice, at least some of which are approximately perpendicular to and intersect with the horizontally oriented (110) surface of the substrate 12. These intersecting (111) planes are referred to herein as vertically oriented (111) planes or surfaces, noting that the (111) planes are approximately vertically oriented relative to the horizontal (110) surface of the substrate 12.

As used herein, the term "horizontal" generally refers to a direction or a plane that is parallel with a surface of the substrate 12 or wafer, while the term "vertical" generally refers to a direction or plane that is substantially or approximately perpendicular to the substrate surface. The specific use of the terms "horizontal" and "vertical" to describe relative characteristics is to facilitate discussion and is not intended to limit embodiments of the present disclosure.

Any suitable insulator layer 14 may be used. In a non-limitative example embodiment, the insulator layer 14 is an oxide. An example of an oxide includes, but is not limited to thermally grown silicon dioxide. Non-limitative examples of other suitable materials for the insulator layer 14 include nitrides, oxynitrides, or the like, or combinations thereof.

The insulator layer 14 may be established using any suitable growth or deposition technique. A thermal oxide insulator layer may be formed by the oxidation of silicon, which forms silicon dioxide. Various oxide and nitride insulator layers may be established via deposition techniques which include, but are not limited to low-pressure chemical vapor deposition (LPCVD), plasma enhanced chemical vapor deposition (PECVD), atmospheric pressure chemical vapor deposition (APCVD), or any other suitable chemical or physical vapor deposition techniques. In one embodiment, the insulator layer 14 is established as two separate layers having the exposed portion 16 of the substrate surface therebetween. In another embodiment, the insulator layer 14 is grown or deposited as a substantially continuous layer, and is then patterned (e.g., via photolithography) and etched (e.g., via dry or wet chemical etching) to expose the portion 16 of the substrate surface (as shown in FIG. 1A).

Referring now to FIG. 1B, an epitaxial layer 18 of a first conductivity type is established on at least the exposed portion 16, and in some embodiments, on at least a portion of the insulator layer 14 adjacent to the exposed portion 16. It is to be understood that the exposed portion 16 acts as a seed for the growth of the epitaxial layer 18 of the first conductivity type. Generally, the epitaxial layer 18 is established via thermal chemical vapor deposition. A non-limitative example of the epitaxial layer 18 includes silicon, and non-limitative examples of the first conductivity type include p-type conductivity or n-type conductivity.

As the epitaxial layer 18 grows, it may be doped with a dopant that is capable of introducing the first conductivity type to the epitaxial layer 18. Dopants for achieving p-type conductivity include, but are not limited to boron, other like elements, or combinations thereof; and dopants for achieving n-type conductivity include, but are not limited to phosphorus, arsenic, antimony, other like elements, or combinations thereof.

The epitaxial layer 18 of the first conductivity type is established to a predetermined height that is determined, at least in part, by a desirable height for an electrode 18' of the first conductivity type (shown in FIG. 1B). Generally, the predetermined height is higher than a thickness of the insulator layer 14. Furthermore, the epitaxial layer 18 of the first conductivity type may also be established so that it expands laterally across the portion(s) of the insulator layer 14 adjacent to the exposed portion 16. This lateral epitaxial overgrowth continues until the desirable dimensions (e.g., predetermined height, desirable distance over the insulator layer 14, etc.) of the epitaxial layer 18 are achieved.

It is to be understood that the epitaxial layer 18 of the first conductivity type functions as an electrode 18' of the first conductivity type. Referring now to FIG. 1C, an embodiment of the method includes removing a portion of the epitaxial layer 18 of the first conductivity type to re-expose a portion 16' of the substrate surface. This forms an electrode 18' of the first conductivity type that is electrically isolated from the substrate 12, and any circuitry located therein/thereon.

FIG. 1D depicts the establishment of a masking layer 15 on at least the electrode 18' of the first conductivity type. It is to be understood that the masking layer 15 aids in protecting the electrode 18' of the first conductivity type during subsequent formation of the epitaxial layer 20 (shown in FIG. 1E). It is to be understood that the masking layer 15 may also be established on the insulator layer 14. A non-limitative example of the masking layer 15 is an oxide layer.

Referring now to FIG. 1E, an epitaxial layer 20 of a second conductivity type is established on the re-exposed portion 16' of the substrate 12, and in some embodiments on portion(s) of the insulator layer 14 adjacent to the re-exposed portion 16'. It is to be understood that the re-exposed portion 16' also acts as a seed for the growth of the epitaxial layer 20 of the second conductivity type. In an embodiment, the epitaxial layer 20 is established via thermal chemical vapor deposition, and as it grows, it is doped with a dopant capable of introducing the second conductivity type to the epitaxial layer 20. A non-limitative example of the epitaxial layer 20 includes silicon, and non-limitative examples of the second conductivity type include n-type conductivity or p-type conductivity.

It is to be understood that the first and second conductivity types may be the same or different. In a non-limitative example, the epitaxial layer 18 of the first conductivity type has p-type conductivity, and the epitaxial layer 20 of the second conductivity type has n-type conductivity, or vice versa. In other embodiments, both the first and second conductivity types have p-type conductivity or n-type conductivity.

The epitaxial layer 20 of the second conductivity type is established to a predetermined height that is determined, at least in part, by a desirable height for an electrode 20' (shown in FIGS. 1E and 1H), 20" (shown in FIG. 1F) of the second conductivity type. Similar to the epitaxial layer 18 of the first conductivity type, the epitaxial layer 20 of the second conductivity type may expand laterally across the portion(s) of the insulator layer 14 adjacent to the re-exposed portion 16'. This lateral epitaxial overgrowth continues until the desirable dimensions (e.g., predetermined height, desirable distance over the insulator layer 14, etc.) of the epitaxial layer 20 are achieved. It is to be understood, however, that the epitaxial layers 18, 20 remain electrically isolated from each other (generally, with at least a portion of the insulator layer 14 therebetween).

The epitaxial layer 20 of the second conductivity type functions as an electrode 20' (FIGS. 1E and 1H), 20" (FIG. 1F) of the second conductivity type. As depicted in FIG. 1E, the electrode 20' of the second conductivity type is established on the re-exposed portion 16' of the substrate 12, and thus may be electrically connected to any circuitry located in or on the substrate 12.

Referring now to FIG. 1F, an embodiment of the method may further include removing a portion of the epitaxial layer 20 of the second conductivity type to again expose the portion 16" of the substrate surface. It is to be understood that, in an embodiment, some of the epitaxial layer 20 established on the insulator layer 14 may also be removed. Removal of the portion(s) of the epitaxial layer 20 may be accomplished by directional dry etching or wet chemical etching. After removal, an electrode 20" of the second conductivity type is formed that is electrically isolated from the substrate 12 and any circuitry located therein/thereon.

FIGS. 1E and 1F also depict the removal of the masking layer 15. It is to be understood that the masking layer 15 is removed from the electrode 18' after the epitaxial layer 20 of the second conductivity type is formed. Removal of the masking layer 15 may be accomplished by wet chemical etching processes, dry etching processes (e.g., directional dry etching or isotropic plasma etching), or combinations thereof.

In an alternate embodiment of the method, after the epitaxial layer 18 of the first conductivity type is established (a non-limitative example of which is shown in FIG. 1B), a portion of the epitaxial layer 18 may be removed so that another portion of the epitaxial layer 18 remains on the insulating layer 14, on the exposed portion 16 of the substrate surface, or on both the layer 14 and the exposed portion 16 (as shown in FIG. 1G). It is to be understood that if the epitaxial layer 18 remains on the insulating layer 14 (and not on the substrate 12), an electrode 18' that is electrically isolated from the substrate 12 is formed (not shown in FIG. 1G); and that if the epitaxial layer 18 remains on the exposed portion 16, an electrode 18''' that is configured to be electrically connected to the substrate 12 is formed (as shown in FIG. 1G).

In any of the embodiments disclosed herein, it is to be understood that the epitaxial layer 18 may be established at a desirable height, length, or configuration so that removal of portions of the layer 18 may be unnecessary.

As depicted in FIG. 1G, a masking layer 15 may be established on the electrode 18''' for protection of the electrode 18''' during subsequent processing.

FIG. 1G also depicts the removal of a second portion of the insulator layer 14 so that a second portion 17 of the substrate surface is exposed. Removal of the second portion of the insulating layer 14 may be accomplished using those techniques that are suitable for removing the first portion of the insulator layer 14. It is to be understood that the second portion 17 is formed so that it is isolated from the first portion 16.

Referring now to FIG. 1H, an epitaxial layer 20 of the second conductivity type is established in the second portion 17, and optionally on portions of the insulator layer 14 adjacent to the second portion 17. The epitaxial layer 20 of the second conductivity type forms the electrode 20', which is electrically isolated from the epitaxial layer 18 and which may be electrically connected to the substrate 12. The device 10 shown in FIG. 1H has both the electrode 18''' of the first conductivity type and the electrode 20' of the second conductivity type configured to be electrically connected to the substrate 12. It is to be understood that the electrodes 18''', 20' are connected to respective first and second regions of substrate 12, and that those regions are electrically isolated from each other.

The epitaxial layer 20 as shown in FIG. 1H may also be partially removed (as described herein) to re-expose the second portion 17 and to form an electrode 20" (not shown in FIG. 1H) that is established on the insulator layer 14 and is electrically isolated from the substrate 12.

The embodiments of the device 10 (shown in FIGS. 1E, 1F and 1H) each has an electrode pair, including one electrode 18', 18''' of the first conductivity type and one electrode 20', 20" of the second conductivity type. The electrode 18', 18''' of the first conductivity type has a vertical sidewall 26 that faces a vertical sidewall 28 of the electrode 20', 20" of the second conductivity type. A gap 30 formed between these sidewalls 26, 28 may have one or more nanowires grown laterally therebetween.

FIGS. 2A through 2F depict an embodiment of the method for forming a device 10 using a silicon-on-insulator (SOI) substrate. As depicted, a pre-purchased or pre-formed SOI substrate includes a substrate 12, insulator layer 14, and a silicon layer 18" of the first conductivity type. In an embodiment, one or both of the silicon layer 18" and the substrate 12 of the SOI substrate preferably has (110) crystallographic orientation.

Figure 2A:
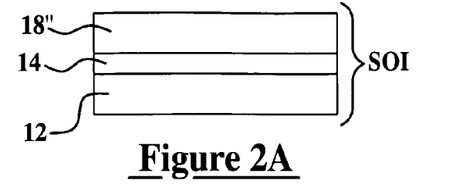
FIGS. 2A through 2F depict an alternate embodiment for forming a device configured to have a nanowire formed laterally between two electrodes.
Figure 2B:
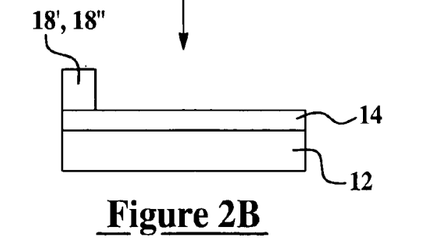

FIG. 2B depicts the formation of the electrode 18' of the first conductivity type from the silicon layer 18" of the first conductivity type. Generally, the electrode 18' of the first conductivity type is formed by patterning (e.g., via photolithography) a desirable electrode design in the silicon layer 18" of the first conductivity type, and etching (e.g., via dry etching, wet chemical etching, or combinations thereof) the silicon layer 18" of the first conductivity type to form the electrode 18'.

Figure 2C:
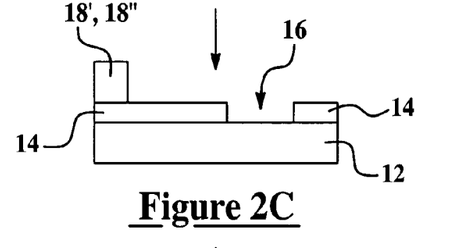

Referring now to FIG. 2C, a portion of the insulator layer 14 of the SOI substrate is removed to expose a portion 16 of the substrate surface. The portion of the insulator layer 14 may be removed by patterning (e.g., via photolithography) a predetermined design on the insulator layer 14, and etching (e.g., via dry or wet chemical etching) the insulator layer 14 to expose the portion 16 of the substrate surface.

Figure 2D:
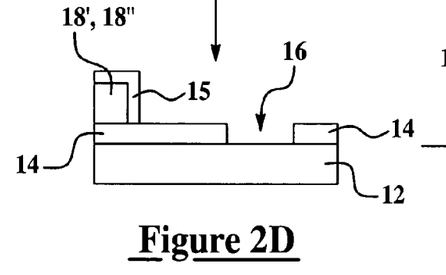

Establishment of the masking layer 15 on at least the electrode 18' of the first conductivity type is shown in FIG. 2D. As previously described, the masking layer 15 aids in protecting the electrode 18' of the first conductivity type during subsequent formation of the epitaxial layer 20 (shown in FIG. 2E).

Figure 2E:
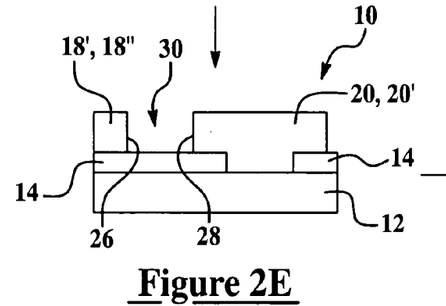

Referring now to FIG. 2E, an epitaxial layer 20 of a second conductivity type is established on the exposed portion 16 of the substrate 12, and on at least a portion of the insulator layer 14 adjacent to the exposed portion 16. It is to be understood that the epitaxial layer 20 of the second conductivity type is established so that it is electrically isolated from the electrode 18' of the first conductivity type. As previously described hereinabove, the exposed portion 16 acts as a seed for the growth of the epitaxial layer 20 of the second conductivity type, which may be grown vertically and optionally laterally to predetermined dimensions. Furthermore, the epitaxial layer 20 may be doped with a dopant configured to introduce the second conductivity type to the epitaxial layer 20 during growth (e.g., during thermal chemical vapor deposition).

The epitaxial layer 20 of the second conductivity type functions as the electrode 20' (shown in FIG. 2E), 20" (shown in FIG. 2F) of the second conductivity type. As depicted in FIG. 2E, the electrode 20' of the second conductivity type is established in contact with the substrate 12, and thus may be electrically connected to any circuitry located in or on the substrate 12.

Figure 2F:
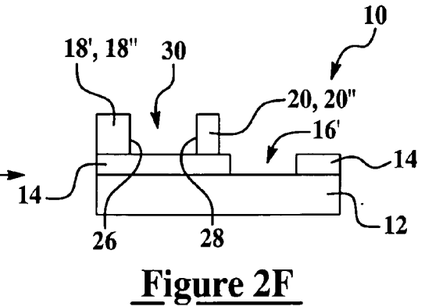

FIG. 2F depicts an embodiment of the device 10 in which a portion of the epitaxial layer 20 of the second conductivity type is removed to re-expose the portion 16' of the substrate surface. Removal of the portion(s) of the epitaxial layer 20 may be accomplished by methods previously described herein. After removal, an electrode 20" of the second conductivity type is formed that is electrically isolated from the substrate 12 and any circuitry located therein/thereon.

Figure 2G:
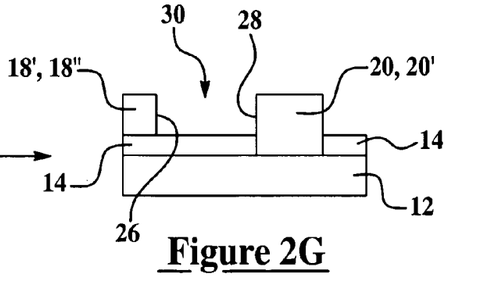

Referring now to FIG. 2G, an alternate embodiment of the device 10 is depicted. In this embodiment, the epitaxial layer 20 is established so that it does not grow laterally on portion (s) of the insulator layer 14. As depicted, the electrode 20' that is formed from the epitaxial layer 20 is configured to be electrically connected to the substrate 12 and any circuitry located therein/thereon.

FIGS. 2E, 2F, and 2G also depict the removal of the masking layer 15. The masking layer 15 is removed (via any suitable process described herein) after the epitaxial layer 20 of the second conductivity type is formed.

The devices 10 shown in FIGS. 2E, 2F and 2G are capable of having a nanowire formed in a gap 30 thereof. Similar to the devices shown in FIGS. 1E and 1F, the electrode 18' of the first conductivity type has a vertical sidewall 26 that faces a vertical sidewall 28 of the electrode 20', 20" of the second conductivity type to form the gap 30.

Figure 3A:
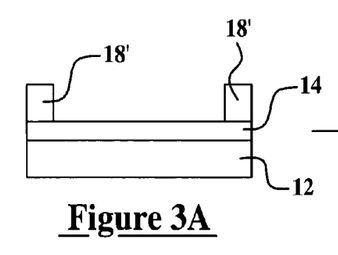
FIGS. 3A through 3G depict still another embodiment for forming a device configured to have two pairs of electrodes, each pair capable of having a nanowire formed laterally therebetween.

Referring now to FIGS. 3A through 3G, another embodiment of the method for forming the device 10 is depicted. As shown in FIG. 3A, in this embodiment, two electrically isolated electrodes 18' of the first conductivity type have been formed in the silicon layer 18" of an SOI substrate. It is to be understood that the embodiment shown in the FIG. 3 series may also have the electrodes 18', 18''' of the first conductivity type formed via an epitaxial layer 18 as described in reference to the FIG. 1 series.

Figure 3B:
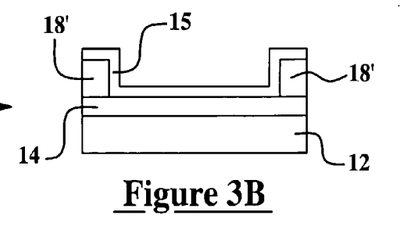

Referring now to FIG. 3B, a masking layer 15 is established on the electrodes 18' of the first conductivity type and optionally on the insulator layer 14. It is to be understood that if the masking layer 15 is formed of a thermal oxide (e.g., silicon dioxide), it may substantially blend with the insulator layer 14, such that there is substantially no appreciable difference in the thickness of the originally established insulator layer 14. As a non-limitative example, the thickness of the insulator layer 14 may increase by about 2 nm or 3 nm when a thermal oxide masking layer 15 is established thereon. It is to be further understood that if the masking layer 15 is formed of a non-thermal oxide (e.g., LPCVD oxide, LPCVD nitride, PECVD oxide, PECVD nitride, APCVD oxide, PECVD oxynitride, or the like), it may have a substantially uniform thickness over both the electrodes 18' of the first conductivity type and the insulator layer 14, thereby increasing the thickness of the insulator layer 14 by the thickness of the established masking layer 15 (one non-limitative example of the masking layer 15 thickness ranges from about 5 nm to about 50 nm).

Figure 3C:
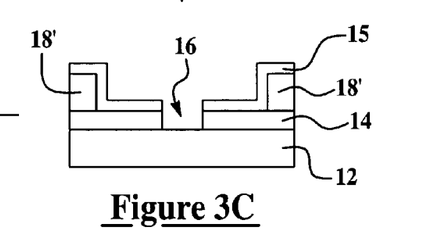

As depicted in FIG. 3C, this embodiment of the method then includes, in addition to removing a portion of the insulator layer 14, also removing a portion of the masking layer 15 to expose a portion 16 of the substrate 12. Generally, the portion(s) of the layer(s) 14, 15 removed are located near the electrically isolated electrodes 18' of the first conductivity type. In a non-limitative example, the portion(s) of the layer (s) 14, 15 removed are located between the electrically isolated electrodes 18' of the first conductivity type. It is to be understood that after removal, enough of the insulator layer 14 and masking layer 15 (if established on the insulator layer 14) should remain so that the electrically isolated electrodes 20" (shown in FIGS. 3F-3G) of the second conductivity type may be formed thereon.

Removal of the layer(s) 14, 15 to expose the portion 16 of the substrate surface may be accomplished by patterning a predetermined design, and etching the layer(s) 14, 15. It is to be understood that the layer(s) 14, 15 are etched so that the surface of the substrate 12 is exposed. In a non-limitative example, the predetermined design is patterned via photolithography, and the layer(s) 14, 15 are etched via dry etching or wet chemical etching.

Figure 3D:
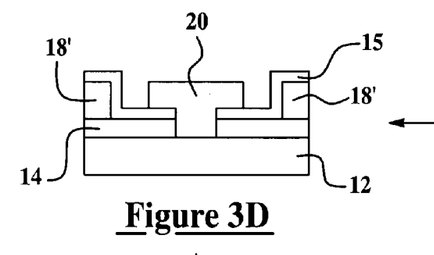

Once the portion 16 of the substrate surface is exposed, the epitaxial layer 20 of the second conductivity type is established on the portion 16 and on portions of the layers 14, 15 adjacent to the portion 16, as shown in FIG. 3D. As previously described, the epitaxial layer 20 may be established vertically (i.e., to a predetermined thickness) and laterally (i.e., extending a predetermined distance over the layers 14, 15) using thermal chemical vapor deposition and doping. Furthermore, the epitaxial layer 20 of the second conductivity type is electrically isolated from each of the electrodes 18' of the first conductivity type.

Figure 3E:
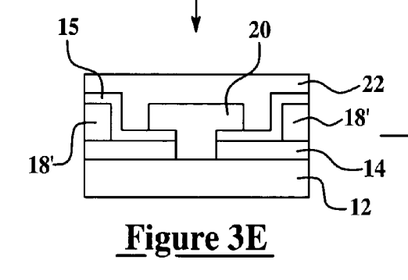

Referring now to FIG. 3E, an optional oxide layer 22 is established on the masking layer 15, the epitaxial layer 20 of the second conductivity type, and on any exposed portions of the insulator layer 14. Plasma enhanced chemical vapor deposition (PECVD) is a non-limiting example of a method that is suitable for establishing the oxide layer 22.

Figure 3F:
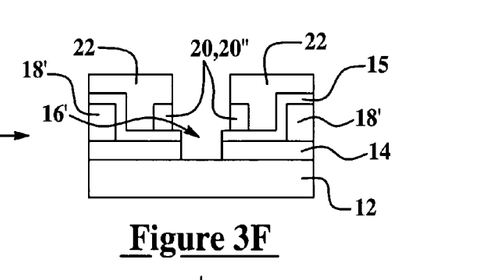
Figure 3G:
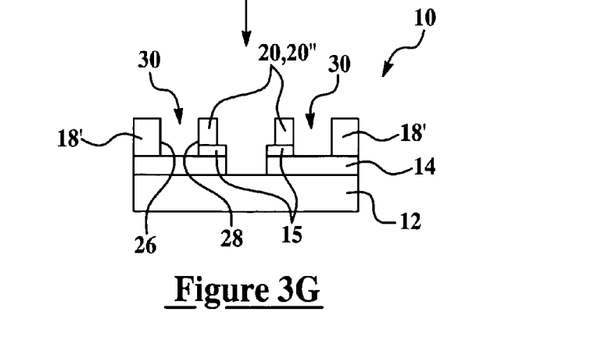

FIG. 3F depicts the removal of a portion of the oxide layer 22 (if present) and a portion of the epitaxial layer 20 of the second conductivity type so that the portion 16' of the substrate surface is re-exposed. The removal of these portions forms two electrodes 20" of the second conductivity type that are electrically isolated from each other, from the electrodes 18' of the first conductivity type, and from the substrate 12. FIG. 3G depicts the removal of the remaining oxide layer 22 (if present) and the masking layer 15 (that remains uncovered by the electrodes of the second conductivity type 20"), thereby exposing the electrodes 18' of the first conductivity type and the electrodes 20" of the second conductivity type.

The device 10 shown in FIG. 3G has two electrode pairs, each pair including one electrode 18' of the first conductivity type and one electrode 20" of the second conductivity type. The area between respective vertical sidewalls 26, 28 of the electrodes 18', 20" in a pair is the gap 30, which is configured to have nanowire(s) grown laterally therein.

Figure 4:
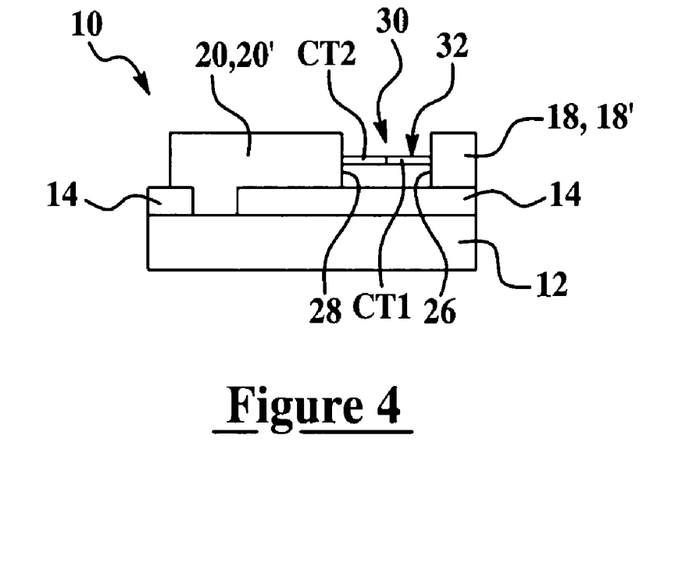
FIG. 4 depicts an embodiment of the device formed in FIG. 1E having a nanowire formed laterally between the two electrodes.
Figure 5:
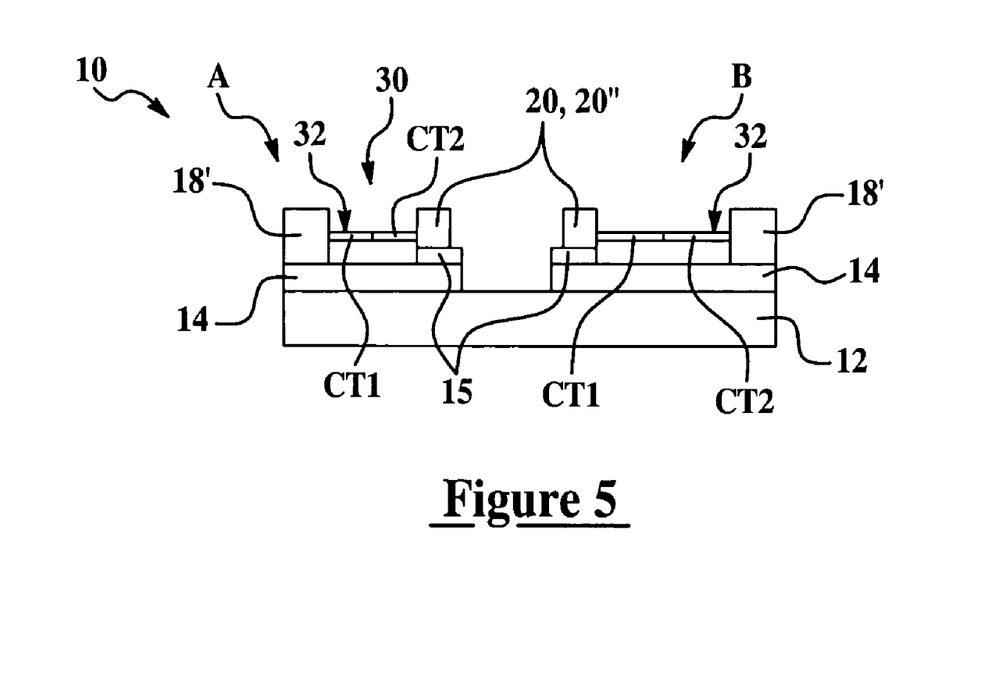
FIG. 5 depicts an embodiment of the device formed in FIG. 3G having nanowire(s) containing one or more junctions formed laterally between each of the two electrode pairs.

Referring now to FIGS. 4 and 5 together, embodiments of the device 10 similar to the device 10 shown in FIG. 1E and in FIG. 3G are respectively shown. Each of the devices 10 generally includes the substrate 12, the insulator layer 14, and one or more pairs of electrodes 18', 20' (shown in FIG. 4) or 18', 20" (shown in FIG. 5), each electrode 18', 20', 20" having a different conductivity type than the other electrode 20', 20", 18' in each pair. The electrode 18' of the first conductivity type has the vertical sidewall 26 that faces the vertical sidewall 28 of the electrode 20', 20" of the second conductivity type. The gap 30 formed between these sidewalls 26, 28 may have one or more nanowires 32 grown laterally therebetween.

The nanowire 32 may be formed via any suitable method. A non-limitative example of forming a lateral nanowire 32 is described in U.S. patent application Ser. No. 10/738,176, filed on Dec. 17, 2003 (U.S. Publication No. 2005/0133476 A1, published Jun. 23, 2005), the specification of which is incorporated herein by reference. Other example methods for forming lateral nanowires 32 are described in "Ultrahigh-density silicon nanobridges formed between two vertical silicon surfaces" by Islam et al., published in 2004 in volume 14 of *Nanotechnology* at pages L5-L8; and "A novel interconnection technique for manufacturing nanowire devices" by Islam et al., published in 2005 in volume 80 of *Appl. Phys. A* at pages 1133-1140.

In the non-limitative example embodiment shown in FIG. 4, the nanowire 32 and electrodes 18', 20' form a second conductivity type-second conductivity type-first conductivity type-first conductivity type structure, where the nanowire 32 has a second conductivity type segment CT2 (adjacent the second conductivity type electrode 20') and a first conductivity type segment CT1 (adjacent the first conductivity type electrode 18'). A non-limitative example of such a structure is a p-type-p-type-n-type-n-type (p-p-n-n) structure, which has a p-p junction, a p-n junction, and an n-n junction. The second conductivity type segment CT2 of the nanowire 32 is grown from the electrode 20' of the second conductivity type. During growth of the nanowire 32, the second conductivity type segment CT2 may be stopped, and a first conductivity type segment CT1 may be grown from the second conductivity type segment CT2. In the embodiment shown in FIG. 4, the first conductivity type segment CT1 forms a connection with the electrode 18' of the first conductivity type.

FIG. 5 shows a non-limitative example embodiment of at least a nanowire 32 grown in the gap 30 between each of the two electrode pairs (where each pair includes one electrode 18' of the first conductivity type and one electrode 20'' of the second conductivity type). In the first electrode pair A, the nanowire 32 and electrodes 18', 20'' form a first conductivity type-first conductivity type-second conductivity type-second conductivity type structure, where the nanowire 32 has a first conductivity type segment CT1 (adjacent the first conductivity type electrode 18') and a second conductivity type segment CT2 (adjacent the second conductivity type electrode 20''). A non-limitative example of such a structure is a p-p-n-n structure, having similar junctions to those described in reference to FIG. 4. In the second electrode pair B, the nanowire 32 and the electrodes 20'', 18' form a second conductivity type-first conductivity type-second conductivity type-first conductivity type structure, wherein the nanowire 32 has a first conductivity type segment CT1 (adjacent the second conductivity type electrode 20'') and a second conductivity type segment CT2 (adjacent the first conductivity type electrode 18'). A non-limitative example of such a structure is an n-p-n-p structure, having an n-p junction, a p-n junction, and an n-p junction.

It is to be understood that segments CT1, CT2 described herein may also be formed of different materials. Further, it is to be understood that a junction formed between two segments CT1, CT2 of different materials is known as a heterojunction.

However, it is to be understood that in the embodiments disclosed herein, any desirable nanowire(s) 32 may be formed in the gap 30. The nanowire(s) 32 may be formed having any number of segments formed of any suitable materials and/or having any desirable conductivity type. Furthermore, the nanowire(s) 32 may have any desirable number of junctions (e.g., p-n junction, or the like) formed therein. It is to be further understood that the number of first conductivity type-second conductivity type junctions may be dependent, at least in part, on the spacing between the electrodes 18', 18''', 20', 20'' and the conductivity type of the electrodes 18', 18''', 20', 20''.

While several embodiments have been described in detail, it will be apparent to those skilled in the art that the disclosed embodiments may be modified. Therefore, the foregoing description is to be considered exemplary rather than limiting.

What is claimed is:

1. A device having a nanowire formed laterally between two electrodes, comprising:
    a substrate;
    an insulator layer established on at least a portion of the substrate;
    an electrode of a first conductivity type established at least on the insulator layer;
    an electrode of a second conductivity type different than the first conductivity type established at least on the insulator layer,
    the electrodes being electrically isolated from each other through the substrate via the insulator layer;
    wherein the electrode of the first conductivity type has a vertical sidewall facing a vertical sidewall of the electrode of the second conductivity type,
    whereby a gap is located between the two vertical sidewalls;
    the nanowire extending laterally between the two vertical sidewalls,
    the nanowire including:
        at least one segment of a first material and of the first conductivity type;
        at least one segment of a second material and of the second conductivity type,
        the second material being different from the first material; and
        a heterojunction formed between the segments; and
    wherein the electrode of the second conductivity type is also established on the substrate so that the electrode of the second conductivity type is electrically connected to the substrate.

2. The device as defined in claim 1 wherein the electrode of the first conductivity type is one of a p-type electrode or an n-type electrode, and wherein the electrode of the second conductivity type is the other of the n-type electrode or the p-type electrode.

3. The device as defined in claim 1 wherein the electrode of the first conductivity type is formed from a silicon layer of a silicon-on-insulator substrate, and wherein the electrode of the second conductivity type is formed from an epitaxial layer having the second conductivity type.

4. The device as defined in claim 1 wherein the electrode of the first conductivity type is formed from a first epitaxial layer having the first conductivity type, and wherein the electrode of the second conductivity type is formed from a second epitaxial layer having the second conductivity type.

5. A method for forming a device having a nanowire formed laterally between two electrodes, comprising:
    forming an electrode of a first conductivity type from a silicon layer of a silicon-on-insulator substrate so that the electrode of the first conductivity type is established at least on an insulator layer of the silicon-on-insulator substrate,
    the silicon layer having the first conductivity type;
    removing a portion of the insulator layer so that at least a portion of a substrate surface of the substrate is exposed;
    establishing an epitaxial layer at least on the exposed portion,
    the epitaxial layer having a second conductivity type,
    whereby the epitaxial layer of the second conductivity type forms an electrode of the second conductivity type at least on the insulator layer and on the exposed portion of the substrate
    so that the electrode of the second conductivity type is electrically connected to the substrate,
    the electrode of the second conductivity type being electrically isolated from the electrode of the first conductivity type through the substrate via the insulator layer,
    wherein the first conductivity type is different than the second conductivity type and
    wherein the electrode of the first conductivity type has a vertical sidewall facing a vertical sidewall of the electrode of the second conductivity type,
    whereby a gap is located between the two vertical sidewalls; and
    forming the nanowire such that it extends laterally between the two vertical sidewalls, the nanowire including:
        at least one segment of a first material and of the first conductivity type;

at least one segment of a second material and of the second conductivity type, the second material being different from the first material; and a heterojunction formed between the segments.

6. The method as defined in claim 5 wherein establishing the epitaxial layer includes doping the epitaxial layer with a dopant configured to introduce the second conductivity type into the epitaxial layer.

7. The method as defined in claim 5 wherein establishing the epitaxial layer is accomplished by thermal chemical vapor deposition.

8. The method as defined in claim 7 wherein the epitaxial layer is established laterally across at least a portion of the insulator layer adjacent to the exposed portion of the substrate surface.

9. The method as defined in claim 5, further comprising:

establishing a masking layer on the electrode of the first conductivity type prior to establishing the epitaxial layer of the second conductivity type; and removing the masking layer subsequent to establishing the epitaxial layer of the second conductivity type.

10. The method as defined in claim 5 wherein at least two electrically isolated electrodes of the first conductivity type are formed, and wherein prior to removing the portion of the insulator layer, the method further comprises establishing a masking layer on the at least two electrically isolated electrodes of the first conductivity type and on the insulator layer.

11. A method for forming a device having a nanowire and at least one junction formed laterally between two electrodes, comprising:

establishing an insulator layer on a substrate so that a first portion of a substrate surface remains exposed;

establishing an epitaxial layer of a first conductivity type at least on the exposed first portion, thereby forming an electrode of the first conductivity type at least on the insulator layer;

removing a portion of the epitaxial layer of the first conductivity type, thereby re-exposing the first portion and leaving at least a portion of the epitaxial layer of the first conductivity type on at least a portion of the insulator layer adjacent to the re-exposed first portion;

establishing an epitaxial layer of a second conductivity type at least on the re-exposed first portion, whereby the epitaxial layer of the second conductivity type forms an electrode of the second conductivity type that is electrically isolated from the electrode of the first conductivity type through the substrate via the insulator layer and is established at least on the insulator layer and on the substrate so that the electrode of the second conductivity type is electrically connected to the substrate, wherein the first conductivity type is different than the second conductivity type and wherein the electrode of the first conductivity type has a vertical sidewall facing a vertical sidewall of the electrode of the second conductivity type, whereby a gap is located between the two vertical sidewalls; and forming a nanowire that extends laterally between the two vertical sidewalls, the nanowire including:

at least one segment of a first material and of the first conductivity type;

at least one segment of a second material and of the second conductivity type, the second material being different from the first material; and a heterojunction formed between the segments.

12. The method as defined in claim 11 wherein removing the portion of the epitaxial layer of the first conductivity type forms the electrode of the first conductivity type electrically isolated from the substrate.

* * * * *

UNITED STATES PATENT AND TRADEMARK OFFICE
CERTIFICATE OF CORRECTION

PATENT NO. : 7,804,157 B2
APPLICATION NO. : 11/454446
DATED : September 28, 2010
INVENTOR(S) : Shashank Sharma et al.

It is certified that error appears in the above-identified patent and that said Letters Patent is hereby corrected as shown below:

In column 2, line 27, delete "2F" and insert -- 2G --, therefor.

In column 9, line 62, in Claim 1, delete "laver;" and insert -- layer; --, therefor.

In column 10, line 44, in Claim 5, before "surface" delete "substrate".

In column 10, lines 48-61, in Claim 5, delete
"whereby the epitaxial layer of the second conductivity type
    forms an electrode of the second conductivity type at
    least on the insulator layer and on the exposed portion of
    the substrate
so that the electrode of the second conductivity type is
    electrically connected to the substrate,
the electrode of the second conductivity type being
    electrically isolated from the electrode of the first
    conductivity type through the substrate via the insulator layer,
wherein the first conductivity type is different than the
    second conductivity type and
wherein the electrode of the first conductivity type has a
    vertical sidewall facing a vertical sidewall of the
    electrode of the second conductivity type" and insert
-- whereby the epitaxial layer of the second conductivity type
    forms an electrode of the second conductivity type at
    least on the insulator layer and on the exposed portion of
    the substrate so that the electrode of the second conductivity
    type is electrically connected to the substrate,
the electrode of the second conductivity type being electrically
    isolated from the electrode of the first conductivity
    type through the substrate via the insulator layer, Signed and Sealed this
Seventh Day of June, 2011

David J. Kappos
*Director of the United States Patent and Trademark Office* wherein the first conductivity type is different than the
   second conductivity type and wherein the electrode of
   the first conductivity type has a vertical sidewall facing
   a vertical sidewall of the electrode of the second conductivity
   type, --, therefor.

In column 12, line 2, in Claim 11, delete "re- exposing" and insert -- re-exposing --, therefor.

In column 12, lines 8-20, in Claim 11, delete
"whereby the epitaxial layer of the second conductivity type
   forms
an electrode of the second conductivity type that is electrically
   isolated from the electrode of the first conductivity
   type through the substrate via the insulator layer and
   is established at least on the insulator layer and on the
      substrate so that the electrode of the second conductivity
      type is electrically connected to the substrate,
wherein the first conductivity type is different than the
   second conductivity type and
wherein the electrode of the first conductivity type has a
   vertical sidewall facing a vertical sidewall of the electrode
   of the second conductivity type," and insert
-- whereby the epitaxial layer of the second conductivity type
   forms an electrode of the second conductivity type that is
   electrically isolated from the electrode of the first conductivity
   type through the substrate via the insulator layer and
   is established at least on the insulator layer and on the
   substrate so that the electrode of the second conductivity
   type is electrically connected to the substrate,
wherein the first conductivity type is different than the
   second conductivity type and wherein the electrode of the
   first conductivity type has a vertical sidewall facing a vertical
   sidewall of the electrode of the second conductivity type, --, therefor.